United States Patent
Fork et al.

(10) Patent No.: US 7,525,194 B2
(45) Date of Patent: *Apr. 28, 2009

(54) SYSTEM INCLUDING SELF-ASSEMBLED INTERCONNECTIONS

(75) Inventors: David K. Fork, Los Altos, CA (US);
Thomas Hantschel, Wevelgem (BE);
Michael L. Chabinyc, Burlingame, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 11/191,566

(22) Filed: Jul. 27, 2005

(65) Prior Publication Data

US 2007/0023909 A1 Feb. 1, 2007

(51) Int. Cl.
*H01L 23/48* (2006.01)
(52) U.S. Cl. .................. 257/738; 438/613; 438/108
(58) Field of Classification Search ................ 257/758, 257/738; 438/118, 622, 613, 108
See application file for complete search history.

(56) References Cited

U.S. PATENT DOCUMENTS

| | | | | |
|---|---|---|---|---|
| 4,759,610 | A * | 7/1988 | Yanagisawa | 349/162 |
| 5,225,966 | A * | 7/1993 | Basavanhally et al. | 361/774 |
| 5,508,144 | A | 4/1996 | Katz et al. | |
| 5,565,280 | A * | 10/1996 | Difrancesco | 429/34 |
| 5,616,206 | A | 4/1997 | Sakatsu et al. | |
| 5,834,335 | A * | 11/1998 | Buschbom | 438/107 |
| 6,326,241 | B1 * | 12/2001 | Belke et al. | 438/118 |
| 6,566,744 | B2 | 5/2003 | Gengel | |
| 6,569,496 | B1 | 5/2003 | Wall et al. | |
| 6,693,384 | B1 | 2/2004 | Vicentini et al. | |
| 6,770,369 | B1 * | 8/2004 | Oyamada et al. | 428/403 |
| 6,844,684 | B2 * | 1/2005 | Namiki et al. | 315/169.3 |
| 6,849,948 | B2 * | 2/2005 | Chen et al. | 257/758 |
| 6,858,527 | B2 * | 2/2005 | Gracias | 438/628 |
| 6,923,891 | B2 * | 8/2005 | Cheah et al. | 204/192.11 |
| 7,049,836 | B2 * | 5/2006 | Setaka | 324/754 |
| 7,163,885 | B2 | 1/2007 | Chen et al. | |

(Continued)

FOREIGN PATENT DOCUMENTS

EP 0372880 6/1990

(Continued)

OTHER PUBLICATIONS

Kim, Jung Hyeun, Ehrman, Sheryl, Mulholland, George, Germer, Thomas, Polarized Light Scattering By Dielectric And Metallic Spheres On Silicon Wafers, Optical Society of America, Sep. 1, 2002, pp. 5405-5412, vol. 41, No. 25, Applied Optics.

(Continued)

*Primary Examiner*—Thao X Le
*Assistant Examiner*—Ajay K Arora

(57) ABSTRACT

A method of forming a self-assembled interconnect structure is described. In the method, a contact pad surface and particles in a solution are brought together. The particles are selected such that they the particles adhere to the contact pad surface. Formation of a contact is completed by pressing an opposite contact into the particles such that an electrical connection is formed via the particles between the opposite contact pad and the substrate surface contact pad. The described self-assembled interconnect structure is particularly useful in display device fabrication.

8 Claims, 12 Drawing Sheets

U.S. PATENT DOCUMENTS

| | | | |
|---|---|---|---|
| 2002/0064909 | A1 | 5/2002 | Gracias et al. |
| 2003/0170959 | A1* | 9/2003 | Salafsky ..................... 438/305 |
| 2003/0173612 | A1 | 9/2003 | Krieger et al. |
| 2004/0023479 | A1 | 2/2004 | Tour et al. |
| 2004/0119676 | A1* | 6/2004 | Nam et al. ..................... 345/87 |
| 2004/0156177 | A1* | 8/2004 | Higashitani ................. 361/777 |
| 2005/0040535 | A1 | 2/2005 | Kawata et al. |
| 2005/0048697 | A1 | 3/2005 | Uang et al. |
| 2005/0150684 | A1 | 7/2005 | Hashimoto |
| 2005/0227475 | A1 | 10/2005 | Chen et al. |

FOREIGN PATENT DOCUMENTS

| | | |
|---|---|---|
| EP | 1524695 | 4/2005 |
| JP | 2000 90727 | 3/2000 |
| WO | WO 03028094 | 4/2003 |
| WO | WO 03060995 | 7/2003 |
| WO | WO 03 087590 | 10/2003 |

OTHER PUBLICATIONS

Lee, Ilsoon, Hammond, Paula, Rubner, Michael, Selective Electroless Nickel Plating Of Particle Arrays On Polyelectrolyte Multilayers, 2003 American Chemical Society, Chemical Materials 2003, pp. 4583-4589, vol. 15, No. 24.

Clark, Thomas, Tien, Joe, Duffy, David, Paul, Kateri, Whitsides, George, Self-Assembly Of 10-µm Sized Objects Into Ordered Three-Dimensional Arrays, 2001 American Chemical Society, Journal Am. Chem. Soc. 2001, pp. 7677-7682, vol. 123, No. 31.

Yeh, Hsi-Jen J., Smith, John S., Fluidic Self-Assembly for the Integration of GaAs Light-Emitting Diodes on Si Substrates, 1994 IEEE, IEEE Photonics Technology Letters Jun. 1994, pp. 706-708, vol. 6, No. 6.

Groenendaal, L. Bert, Jonas, Friedrich, Freitag, Dieter, Pielartzik, Harald, Reynolds, John R., Poly(3,4-ethylenediozythiophene) and its Derivatives: Past, Present, and Future, Advanced Materials Dec. 27, 1999.

Tien, Joe, Terfort, Andreas, Whitesides, George, Microfabrication Through Electrostatic Self-Assembly, 1997 American Chemical Society, Langmuir 1997, pp. 5349-5355, Vo. 13, No. 20.

Collman, James, Devaraj, Neal, Chidsey, Christopher, "Clicking" Functionality Onto Electrode Surfaces, American Chemical Society, Langmuir Letters, Dec. 5, 2003, pp. 1-3.

Zheng, Haipeng, Lee, Ilsoon, Rubner, Michael, Hammond, Paula, Two Component Particle Arrays on Patterned Polyelectrolyte Multilayer Templates, Advanced Materials Apr. 18, 2002, pp. 569-572, vol. 14, No. 8.

Lee, Ilsoon, Zheng, Haipeng, Rubner, Michael, Hammond, Paula, Controlled Cluster Size in Patterned Particle Arrays Via Directed Adsorption On Confined Surfaces, Advanced Materials Apr. 18, 2002, pp. 572-577, vol. 14, No. 8.

Collman, et al: "Clicking" Functionality Onto Electrode Surfaces, American Chemical Society, Department Of Chemistry, Stanford University, Dec. 5, 2003.

Tien, et al: Microfabrication Through Electrostatic Self-Assembly, American Chemical Society, May 2, 1997, Langmuir, vol. 13, No. 20, pp. 5349-5355.

Groenendaal, et al: Poly(3,4-Ethylenedioxythiophene) And Its Derivatives: Past, Present, And Future, Advanced Materials.

Cook, et al: Self-Assembled Circuit Patterns, Computer Science And Computation And Neural Systems, California Institute Of Technology.

Gregory, et al: Chameleon Fibers: Dynamic Color Change From Tunable Molecular And Oligomeric Devices, National Textile Center Research Briefs—Materials Competency, Jun. 2001, pp. 6-7.

Hanks, et al: Conducting Polymers As Substrates For Surface-Mounted Molecular Devices, Department Of Chemistry, Furman University.

Nishida, et al: Micropitch Connection Using Anisotropic Conductive Materials For Driver IC Attachment To A Liquid Crystal Display, IBM Journal Of Research And Development, Mar. 1997, vol. 42.

Chah, et al: Nanostructured Gold Hollow Microspheres Prepared On Dissolvable Ceramic Holly Sphere Templeates, Journal Of Colloid And Interface Science 250, 2002, pp. 142-148, Http://www.idealibrary.com.

Noel, et al: Self-Assembled Monolayers Of Alcanethiols On Nickel Surfaces For Low Level Electrical Contact Applications, IEEE, 1997, pp. 212-218.

Xia, et al: Template-Assisted Self-Assembly Of Spherical Colloids Into Complex And Controllable Structures, Advanced Functional Materials, 2003, vol. 13, No. 12, December, pp. 907-918.

Clark, et al: Self-Assembly Of 10-µm-Sized Objects Into Ordered Three-Dimensional Arrays, J. American Chemical Society, 2001, vol. 123, No. 31, pp. 7677-7682.

Zheng, et al: Two Component Particle Arrays On Patterned Polyelectrolyte Multilayer Templates, Advanced Materials, Apr. 18, 2002, vol. 14, No. 8, pp. 569-572.

Lee, et al: Controlled Cluster Size In Patterned Partical Arrays Via Directed Adsorption On Confined Surfaces, Advanced Materials, Apr. 18, 2002, vol. 14, No. 8, pp. 572-577.

Kim, et al: Polarized Light Scattering By Dielectric And Metallic Spheres On Silicon Wafers, Optical Society Of America, Applied Optics, Sep. 1, 2002, vol. 41, No. 25, pp. 5405-5412.

Lee, et al: Selective Electroless Nickel Plating Of Particle Arrays On Polyelectrolyte Multilayers, American Chemical Society, Chem. Mater. 2003, vol. 15, No. 24, pp. 4583-4589.

Opdahl, Peter: Anisotropic Conductive Filme For Flipchip Applications: An Introduction, Flipchip Dot Com, Tutorial 5, Ito America Corporation, Sony Chemicals Corporation, www.itousa.com.

Author Unknown: Patterning Self-Assemblies Into Usable Structures—2D and 3D Colloidal Crystals Presentation, Retrieved From The Worldwide Web, Site And Date Of Publication Unknown.

Abe, Shinji, Oyamada, Masaaki, Kawazoe, Akihoro: Electrical Conductive Particles For Anisotropic Conductive Films, Nippon Chemical Industrial Co., JPN.

Technical Help For Colloidal Gold, Nanoprobes, Incorporated, Oct. 4, 1999.

Zhang, Jiguang, Coombs, Neil, Kumacheva, Eugenia: A New Approach To Hybrid Nanocomposite Materials With Periodic Structures, American Chemical Society, Vo. 124, No. 49, Apr. 15, 2002, pp. 14512-14513.

* cited by examiner

SYSTEM INCLUDING SELF-ASSEMBLED INTERCONNECTIONS

CROSS-REFERENCE TO RELATED APPLICATIONS

Reference is directed to copending, commonly-assigned U.S. application Ser. No. 11/191,435, filed July 27,2005, entitled, "Self-Assembled Interconnection Particles", and U.S. application Ser. No. 11/191,436, filed July 27,2005, entitled, "A Method Of Fabricating Self-Assembled Electrical Interconnections". The subject matter of these applications is hereby incorporated by reference in their entirety.

BACKGROUND

Flat panel display assembly is a complicated process that involves coupling electronic driver chips to circuitry mounted on a glass substrate. Often flat panel displays use chip-on-glass (COG) bonding to connect row and column driver circuitry to glass mounted display electronics. COG bonding often utilizes an anisotropic conducting film (ACF) tape containing a dispersion of conducting particles held together by an adhesive. An article entitled "Micropitch connection using anisotropic conductive materials for driver IC attachment to a liquid crystal display" IBM Journal of Research and Development, Vol. 42, Numbers 3/4, 1998 describes the use of ACF tape and is hereby incorporated by reference in its entirety. In particular, the article describes applying bumps of gold to the contact pads of the driver chips while the driver chips are still in wafer form. The chips are then diced from the wafer.

Applying bumps to the wafer is typically an expensive process that involves numerous process steps including sputtering thin metal films, photolithographic masking, electroplating and chemical etching. These methods are used to produce bumps at the fine pitches needed for displays with small pixels such as those used in portable devices. For coarser pitch bumps electroless plating avoids photolithographic masking and offers a simpler and less expensive method of bump deposition. However, electroless plating offers limited pitch and involves plating a substantial quantity of metal.

During assembly, the ACF tape is applied to bonding pads or contacts on the display edge. Driver chips are pressed and bonded to the other side of the ACF tape. Heat and pressure applied during bonding causes melting and flowing of the tape adhesive. Ideally, particles are sandwiched between the display contacts and the driver chip contacts to form an electrical contact. Unfortunately, the adhesive flowing can "wash out" some particles in the ACF film. The washed out particles can accumulate between adjacent pads and cause electrical shorts.

A second problem results from the limited compliance of anisotropic particles in ACF tape. Incompressible, larger anisotropic particles can create large gaps between the driver chips and a contact pad. A large gap between a display contact pad and a driver chip contact can produce open adjacent contacts between an adjacent display contact pad and a corresponding adjacent driver chip contact.

Another type of electronic interconnection is solder bumping. In solder bump wafer level packaging, a solder bump or ball is placed onto the electrical contact pads of a wafer by electroplating, screen printing or vacuum ball placement. Although solder bumps avoid ACF tape problems, solder bump fabrication involves non-recurring engineering expenses for the creation of masks, screens or vacuum receptacles.

Thus, an improved method of interconnecting chips, especially chips with bumped contacts is needed.

SUMMARY

A method of forming a self-assembled interconnect structure is described. In the method, a contact pad is formed on a substrate. The contact pad is exposed to a plurality of particles. The contact pad surface and the solution particles are selected such that at least one of the particles bonds to the contact pad. Particles that do not bond to the contact pad are subsequently removed. Pressing an opposite contact pad into the particles bonded to the contact pad forms an electrical connection between the two contact pads.

One of the uses for the described self-assembled interconnect structure is in display devices. In particular, the described method can be used to connect driver chips to display device address lines, especially address lines mounted on a transparent substrate such as glass.

Another use for the described self-assembled interconnect structure is a replacement for solder bumping. In particular, the described method can be used to attach bumps either containing solder, or subsequently coated with solder to integrated circuit contact pads.

DETAILED DESCRIPTION

A novel method of interconnecting electronic components is described. The method uses self-assembled interconnect particles to couple electronic components together to form an electronic assembly.

Figure 1:
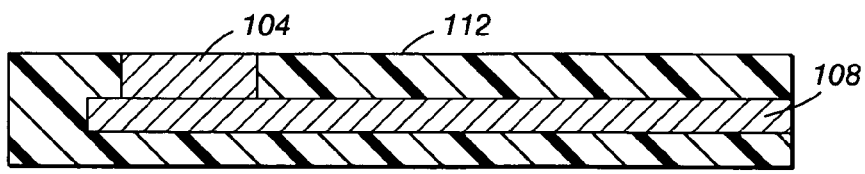
FIGS. 1-4 show a basic interconnection formation process

FIGS. 1-4 show a basic interconnect formation process. In FIG. 1, an electrical contact or contact pad 104 couples to an electrical wire 108. As used herein, "wire" and "electrical wire" are broadly defined as any conductor designed to carry an electrical current, including but not limited to printed and integrated circuit traces, wires and flexible interconnects. As used herein, "contact pad" is broadly defined as any point to which another electrical conductor may be connected such that electricity may flow between the contact pad and the other conductor. The contact pad itself may be made from any conductor, but is typically made from a metal, such as gold, copper, aluminum or indium-tin oxide. Electrical wire or trace 108 couples contact pad 104 to additional electronic components (not shown). The wire may rest adjacent a substrate or be embedded in an insulating substrate 112. In one example, the wire or trace couples a contact pad to a display driver integrated circuit chip. A second wire or trace connects a second contact pad to an address line of a display system. The address line couples to transistors or pixel elements in the display system. When the two contact pads are connected to form an interconnect, signals from the display driver integrated circuit can be transferred to the display system pixel elements.

Figure 2:
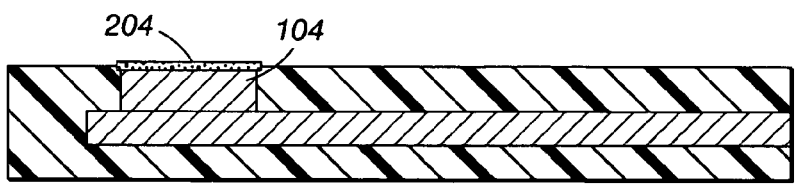
Figure 3:
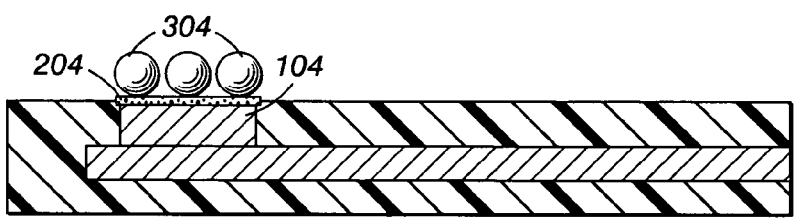

Several methods may be used to bind particles to contact pad 104. Example methods include electrostatic, magnetic, surface tension or chemical forces. In FIG. 2, a binding layer 204 selectively adheres to contact pad 104. In one embodiment, contact pad 104 is a gold contact pad with a thiol compound binding layer. In a general organothiol thiol compound formula RSH, R represents an organic moiety with a substituent thiol group. The thiol group can react with the gold contact pad to form a covalently attached binding layer 204. In some cases, the organothiol can react with the surface to form a layer that is the thickness of a single molecule, commonly referred to as a self-assembled monolayer.

It will be noted that although gold may be a particularly suitable contact pad metal for the attachment of particles, other contact metals such as copper and aluminum can be readily adapted to the described process. Example steps for aluminum and copper based pad metallurgies can include (1) Using solvents and acids to clean the pad of organics, silicon oxides, and/or nitrides, (2) Removing aluminum oxide or copper oxide with an alkaline or acid based etch, (3) activating the aluminum or copper with zincate or palladium, (4) electroless nickel plating a thin Ni layer using ammonia based plating solution and (5) Plating a thin gold layer using a cyanide or sulfate based solution.

In one embodiment, an optional layer (not shown) may be selectively applied to substrate 112 surface, (and not to contact pad 104). The optional layer inhibits particle attachment to non contact pad regions.

After bonding layer 204 deposition, contact pad 104 may be rinsed to remove any non-bonded residues. The contact pad 104 may then be exposed to freely moving particles that selectively attach to the contact pad. As used herein, "freely moving" is broadly defined as any particle that is not bound in a solid. Thus, "freely moving particles" may be introduced for example in an aerosol, in a particulate cloud, or in a fluid containing the particles. The fluid containing the particles may be a colloidal suspension solution or other techniques, such as agitation, may be used to keep the particles suspended in solution. "Particles" as used herein, are broadly defined as solid entities ranging in size from tens of nanometers to hundreds of microns. "Particle" as used herein are made up of more than one atom and more than one molecule, thus a single atom and/or molecule by itself shall not be considered a particle. Typically, particles will be made up of well over a hundred atoms. A "Particle" as used herein shall have at least one dimension exceeding one nanometer. A "Dimension" is commonly understood to be the height, length or width of an arbitrary object positioned at an arbitrary orientation. Another way of looking at it, and a definition that is used herein, is that a dimension is the straight line distance between any two selected points on the surface of the particle.

In order to improve particle adhesion, once the particles 304 are bonded, they can be further anchored to the electrical contact 104 or "bump" by plating additional metal onto the particles 304. The plating forms an electroless plated or electroplated metal connection between the particle and the contact pad or "bump". Electroless plating allows selective metal application to the contact structure without additional masking, and avoids attachment of electrodes to the substrate. In one embodiment, binding layer 204 may be at least partially removed prior to the plating step by procedures such as ultra-violet ozone exposure or oxygen plasma ashing. Directional methods for the partial removal of binding layer 204 that leave intact the binding layer portion beneath particles 304 may help to keep the particles 304 attached during transferal of the substrate into a plating bath.

Figure 4:
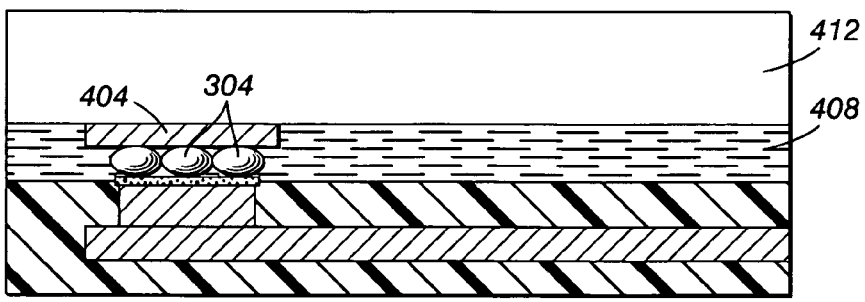

FIG. 4 shows a completed interconnect structure where a second contact 404 is brought into contact with bonded particles 304. A liquid adhesive that is subsequently cured or other nonconducting film 408 bonds upper layer 412 to the underlying substrate. When the described technique is used to fabricate a display, upper layer 412 may be part of a display and the lower contact pad 104 couples to driver chips that control the display.

Figure 5:
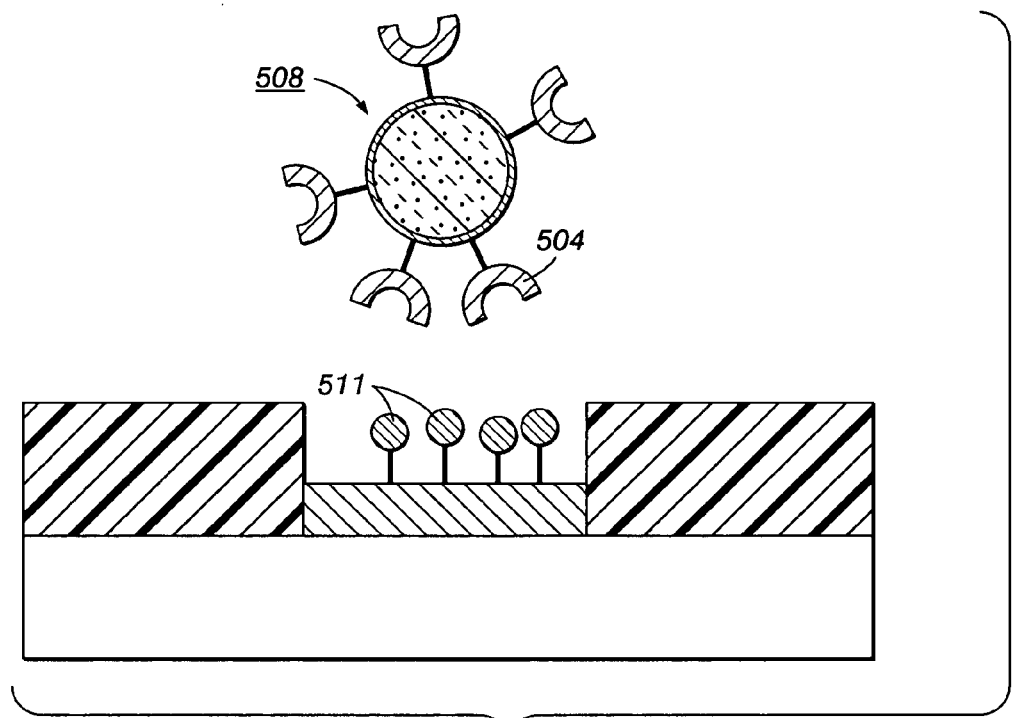
FIG. 5 shows a generalized chemical reaction process between two reactive molecules which may be used to bond particles to a contact pad.

Many bonding methods may be used to move and attach particles to a contact pad. The particles and contact pad can be coated with a layer comprising one of a pair of reactive molecules (504 and 511) (FIG. 5). In one embodiment, the layer on the particle comprises acetylene functional groups and the layer on the contact pad comprises azide groups. In the presence of a copper-based catalyst, these groups will bond to form a triazole through a dipolar addition reaction. In an alternate embodiment, the reactive pair comprises a carboxylic acid anhydride and an amine.

Figure 6:
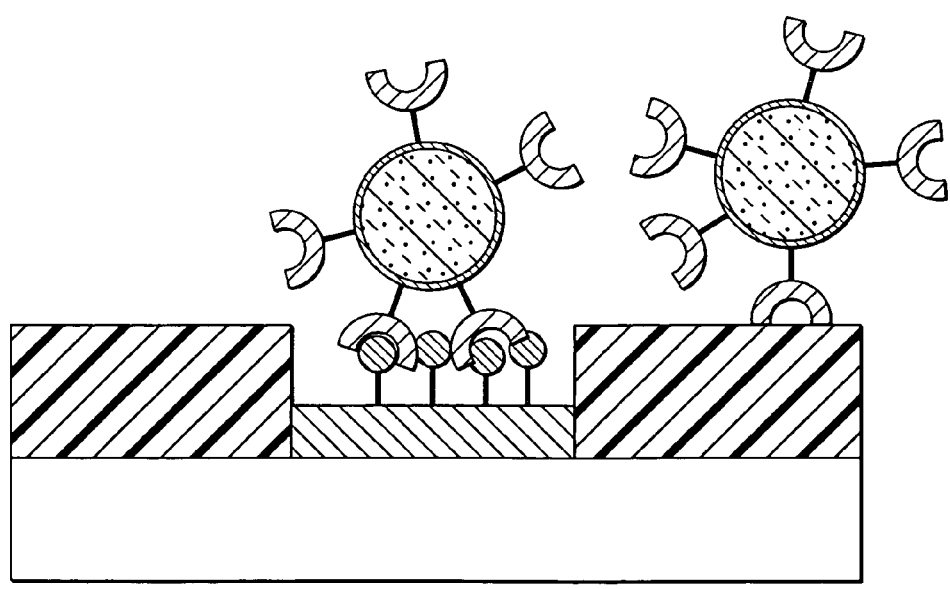
FIG. 6 shows a method of removing excess particles.

After linker molecule attachment, FIG. 6 shows excess particle removal using a wash step. Examples of typical wash steps might include light sonification, ozone cleaning as well as other known wash methods.

Figure 7:
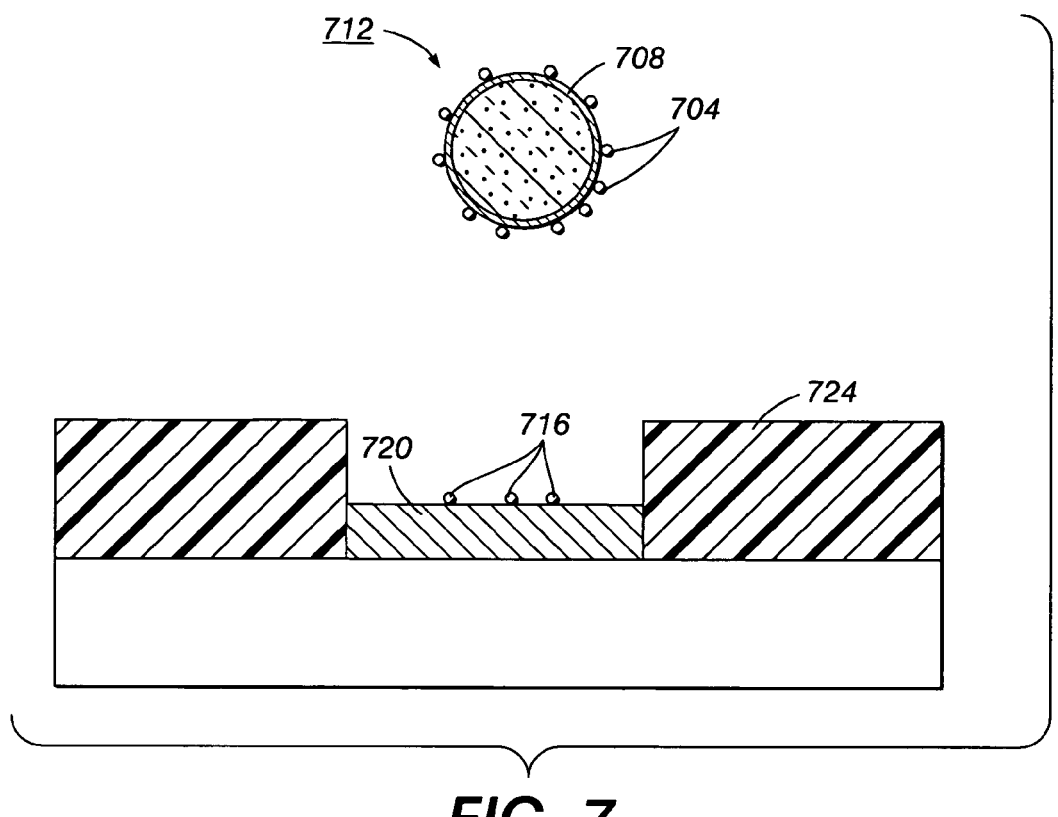
FIG. 7-8 shows using low melting point silver nanoparticles to facilitate attachment of a microsphere to a coating.
Figure 8:
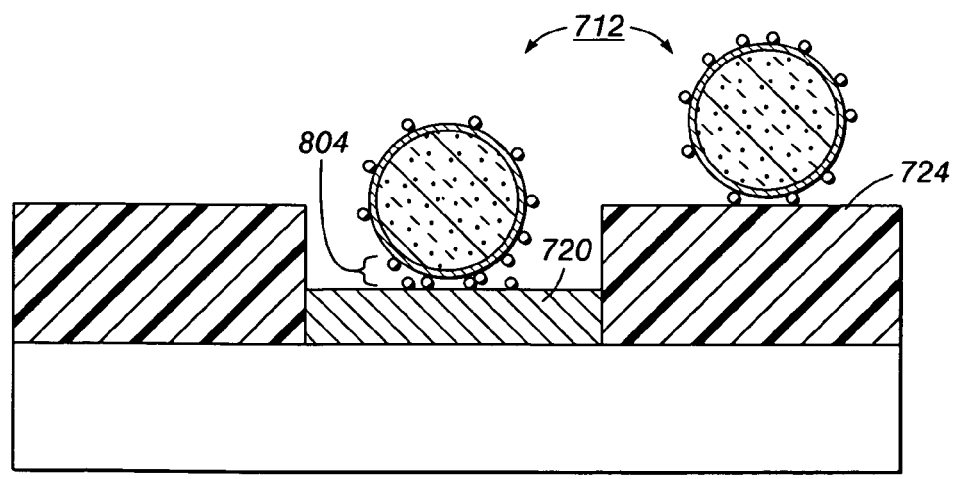

FIG. 7 illustrates using a low melting point (less than 200 degrees Centigrade) silver nanoparticles 704 attached to a microsphere 712 coating 708. In one embodiment, coating 708 is a gold coating on a polymer microsphere 712. The contact pad surface may be treated such that silver nanoparticles 716 adhere to a metallic contact 720 but not to adjacent nitride/polymer passivation layers 724. FIG. 8 shows nanoparticles loosely adhering to nanoparticles 716 on metallic contact 720. When heated, the nanoparticles 804 melt and fuse producing a strong bond between microsphere 712 and metallic contact 720. Microspheres on passivation layers 724 form a weak, easily broken adhesion that breaks during washing.

Figure 9:
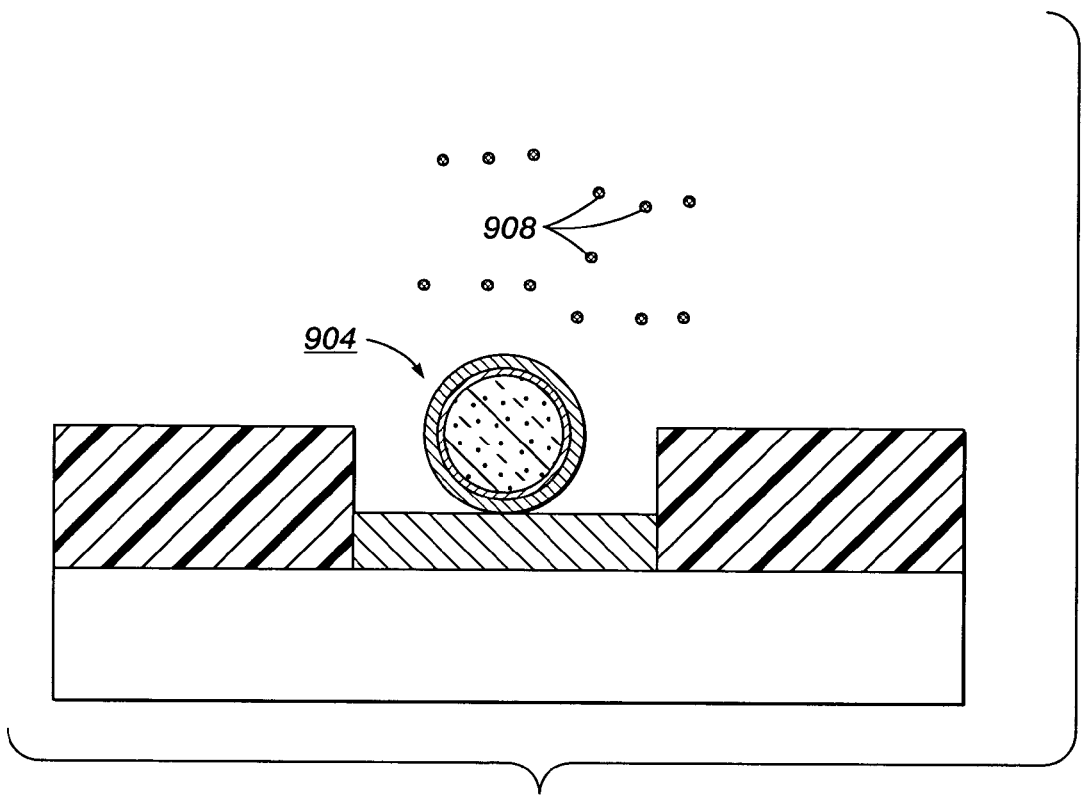
FIG. 9-10 shows using a magnetic field to move and/or bond magnetic particles to a contact pad.
Figure 10:
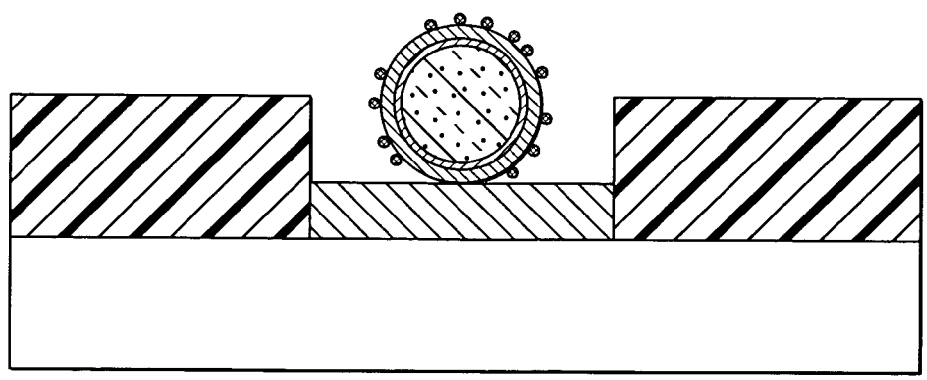

FIGS. 6-8 show chemical techniques of placing and forming bonds, however interconnect self assembly should not be limited to chemical bonding techniques. FIGS. 9 and 10 show using magnetic micro-particles 904 to control the movement of smaller magnetic particles. FIG. 9 shows a larger magnetic micro-particle 904 attached to a contact pad. The magnetic micro-particle could for example be a polymer sphere coated with a layer of Ni to provide magnetic properties, and a subsequent Au layer. Also shown in FIG. 9 are smaller magnetic particles 908 in proximity to the larger particle.

FIG. 10 shows using magnetized larger particles to attract smaller particles to the larger particles. Application of a magnetic field induces magnetic dipoles in the particles, resulting in mutual attraction. Once brought into contact the particles stick to one another by virtue of their surface properties, and remain stuck to one another in the absence of an externally applied magnetic field.

One self-assembled interconnect application is flat panel display fabrication. FIGS. 1-4 describe a method of forming an interconnect from a contact pad that is approximately planar with a supporting substrate. The described interconnect relies on adhering particles to form the contact above the surrounding substrate. However, in some implementations, particle sizes are too small to create sufficient spacing between the two contacting surfaces and a raised contact, often referred to as a bump, may be preferred. Thus FIGS. 11-19 describe using self assembly techniques in conjunction with traditional fabrication techniques to form raised contact bumps. Raised contact bumps increase the spacing between substrates supporting each contact. Thus, raised contacts are particularly suitable to form a display.

Figure 11:
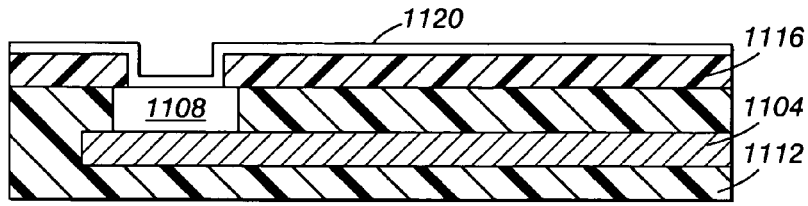
FIGS. 11-19 show the procedures for forming an elevated contact pad and forming a self-assembled interconnect on the elevated contact pad in a procedure which may typically be used in display fabrication.

In FIG. 11, contact pad base 1108 couples to a metal conductor 1104 supported by substrate material 1112. When a display is formed, display driver circuitry is typically formed on silicon wafer chips, thus silicon is a common substrate material, although other materials may also be used. Dielectric passivation layer 1116 protects the electronic circuitry.

In some embodiments, such as in FIGS. 1-4, contact pad base 1108 serves as the contact pad upon which particles are deposited. However, in alternate embodiments, additional contact pad material is deposited to form a raised contact bump. In FIG. 11, a plating cathode seed layer 1120 is formed over contact pad base 1108. Seed layer 1120 is typically made from Au but may be any material upon which a contact pad may be formed.

Figure 12:
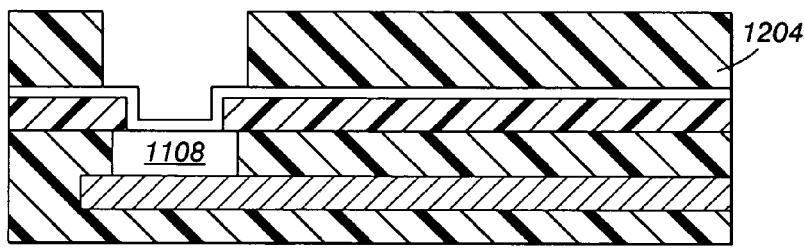
Figure 13:
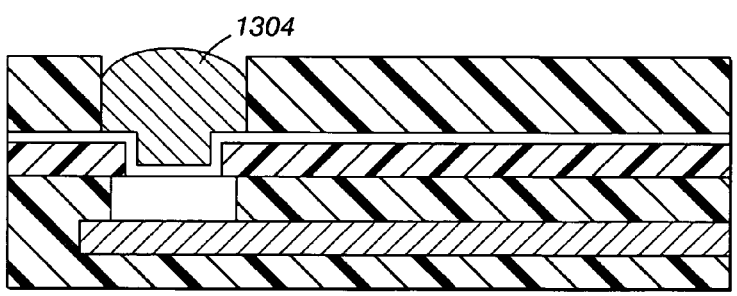

FIGS. 12 and 13 show the formation of contact bump 1304. In FIG. 12, a photoresist layer 1204 is patterned around contact pad base 1108. In FIG. 13, a conductor material deposited in the photoresist gap forms contact bump 1304.

Figure 14:
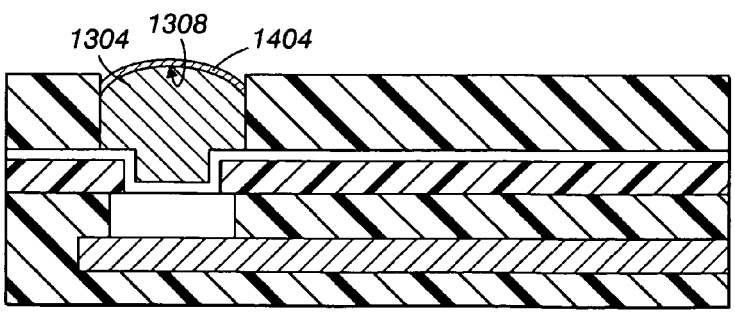
Figure 15:
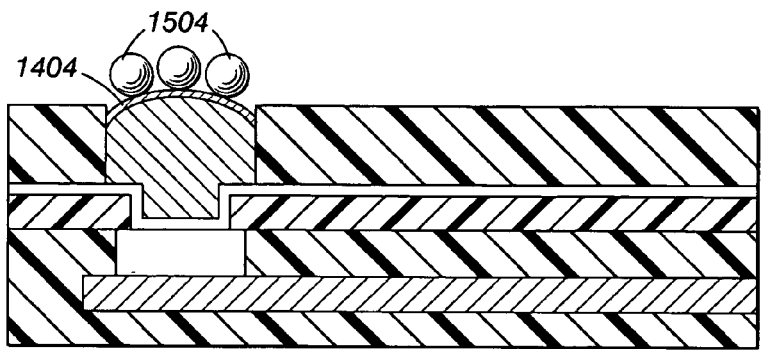
Figure 16:
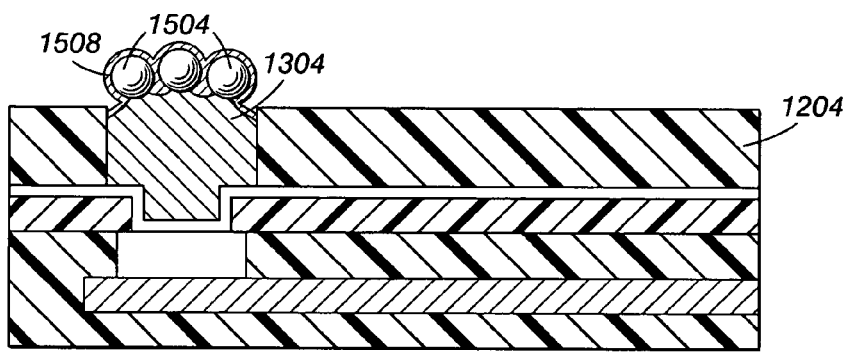

FIGS. 14-16 illustrate the attachment of particles to the contact pad. Attachment may be done using a variety of self assembling procedures, including, but not limited to the attachment procedures described in FIGS. 5-10. In FIG. 14, a particle bonding coating 1404 is added to a contact 1304 top surface 1308. When exposed to a liquid or gas containing particles, particles 1504 adhere to bonding coating 1404 as shown in FIG. 15.

The particles 1504 may be conducting at the time they are self-assembled onto the top surface 1308. Conducting particles may be made from a variety of techniques used for making the particles employed in ACF tape and are commercially available for example from JCI USA Inc. (a subsidiary of Nippon Chemical Industrial Co., Ltd.) 1311 Mamaroneck Avenue, Suite 145, White Plains, N.Y. 10605. These particles may consist of a core and a cladding material. The core material may be organic, for example polystyrene, polymethyl methacrylate, benzoguanamine, etc. or may also be inorganic for example nickel, copper, silica or graphite. The cladding material may be a metal, such as an Au film, or a bilayer of Au on Ni. Typical particle sizes range from 1 to 50 microns.

In an alternate embodiment, the particles 1504 may also be non-conducting at the time they are self-assembled onto the top surface 1308. For example, two and three dimensional colloidal crystals can be assembled from organic particles, (polystyrene, latex) inorganic particles (silicon oxides) and biomolecules (proteins, DNA). Typical particles sizes range from 5 nm to 5 mm. For example Lee, et al. Adv. Mater. 2002, 14, No. 8 pp. 572-7, and hereby incorporated by reference, describes the formation of clusters of carboxylated latex spheres that self-organize onto patterned polymer multilayers. As demonstrated in Lee, et al. Chem. Mater. 2003, 15, 4583-9, it is possible to self-assemble non conducting particles (for example SiO2 or polystyrene) and subsequently apply selective electroless metal plating on to the particles.

Various methods of bonding particles 1504 to bonding coating 1404 may be used. In one method, hydrophobic particles, such as latex or teflon are suspended in a hydrophilic (aqueous) solution. Bonding coating 1404 produces a hydrophobic region that attracts the hydrophobic particles out of the aqueous solution.

In an alternate method, the structure of FIG. 13 is exposed to a bath containing thiol compounds, usually with a general formula RSH, that have a high affinity for gold. When a contact pad, in this case contact bump 1304 is made from gold, the thiol compounds adhere to the gold contact pad. Rinsing the wafer removes the thiol compound from other wafer regions including photoresist layer 1204. The wafer is then exposed to a solution containing a colloidal suspension of gold surfaced particles. The gold surfaced particles then bond to the thiol bonding layer, but not to the other wafer regions.

Using conducting anchoring or bonding molecules facilitates the plating step that reinforces the attachment of a particle to its respective bump or pad. In one embodiment, a conducting polymer comprising a poly(thiophene) backbone and sidechains comprising chemically binding functionalities, such as thiols or amines, can be used to form the binding layer 1404 on the contact pad 1304. In another embodiment, the binding layer 1404 can be composed of an electroplated conducting polymer. Appropriate conducting polymers include those based on ethylenedioxythiophene known as PEDOT. Electrochemical methods to form films of PEDOT derivatives are known and may also be used.

In FIG. 16 bonding coating 1404 is at least partially removed. In some embodiments, after initial bonding of particles 1504 to contact bump 1304, additional metal plating of the particles 1504 can further anchor the particles to the contact bump. The plating forms an electroless plated or electroplated metal connection between the particles 1504 and the bump 1304. The plating firmly anchors particles 1504 to the top of bump 1304, but not to the sides of the bump.

In the illustrated embodiment, the plating forms a conformal layer 1508 on the bump and the particles on the bump. As used herein, a "conformal layer" is broadly defined as a coating or layer in which the growth is non-directional. Thus a conformal layer is usually of relatively uniform thickness because the layers typically grow an approximately equal rate upon all surfaces to which the conformal layer grows (or bonds). Thus the contours of the bump and the particles is typically maintained.

This conformal layer 1508 forms substantially a continuous coating over the contact bump surface and particle surface exposed to the plating bath. As a result, the particles 1504 become joined to bump 1304 both mechanically and electrically. When an electroplating bath is used, plating only occurs where current can flow, that is where there is a conducting path to the plating electrodes attached to the substrate. When an electroless plating bath is used, plating only occurs on surfaces where the plating solution reacts. Typically, this reaction is limited to materials in the contact area (the contact itself and the particles bonded to the contact).

Figure 17:
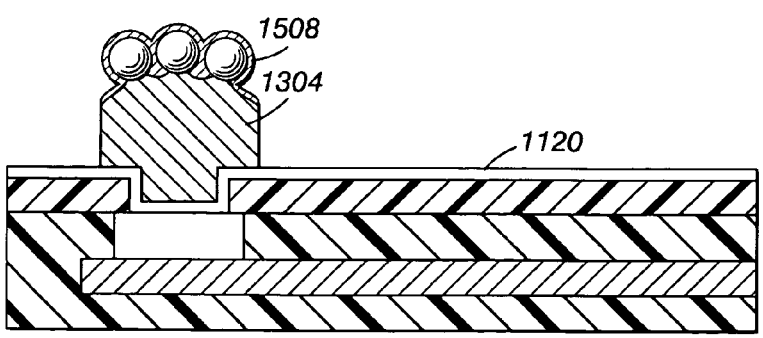
Figure 18:
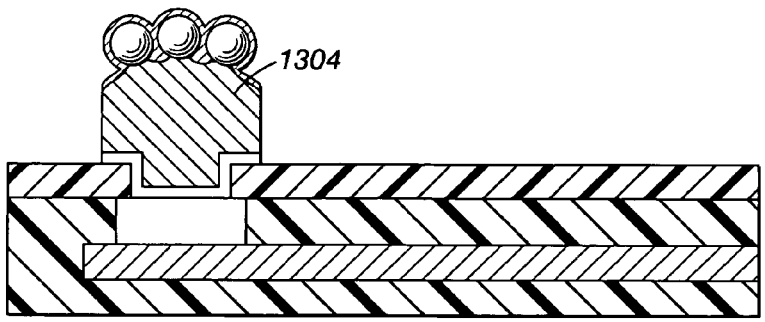
Figure 19:
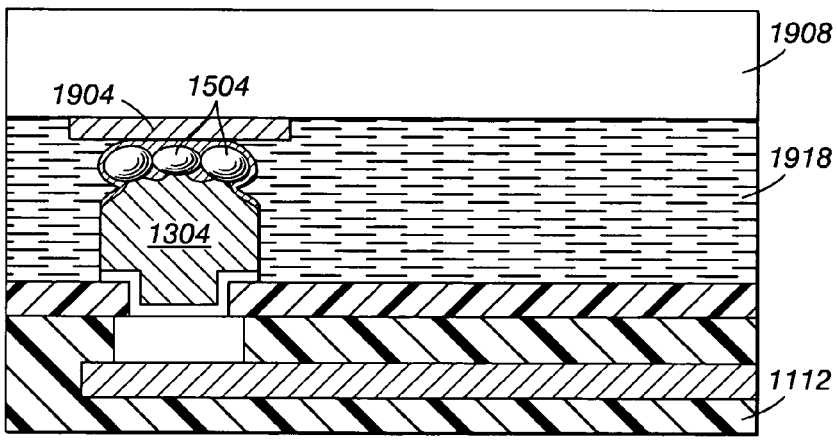

In FIG. 17, the photoresist layer 1204 is removed and in FIG. 18, seed layer 1120 is removed leaving an elevated contact pad or "contact bump" 1304 that rises well above the substrate surface. In FIG. 19, a second contact pad 1904 couples to contact bump 1304 via particles 1504 thereby allowing electricity flow between contact pad 1904 and contact bump 1304. A non-conducting adhesive 1918 fills the remaining space between first substrate 1112 and second substrate 1908. In a generalized display structure, contact pad 1904 mounts on a glass substrate 1908 and couples to display address or data lines. The address lines may couple to electronics or circuit elements such as thin film transistors (TFTs) in a liquid crystal display or other pixel elements that change light transmissivity, light output or light reflectivity in a display system. Driver circuitry such as circuitry on a video processing card to control switching the pixel elements couples to contact bump 1304.

Figure 20:
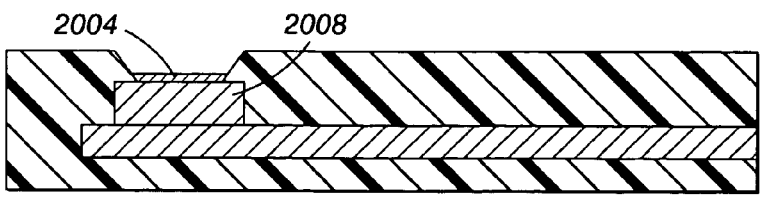
FIGS. 20-22 show using self assembling techniques to place and bond large solder bumps to contact pads.
Figure 21:
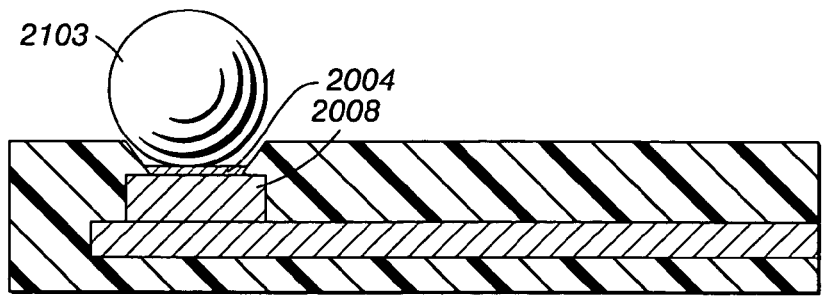
Figure 22:
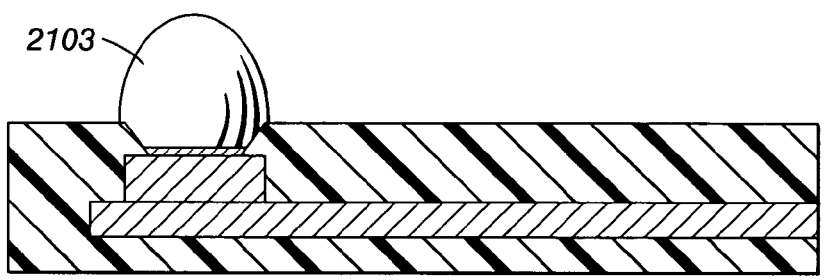

The examples of FIG. 18-19 shows an elevated contact bump 1304 that rises above the substrate surface. Elevated contact pads are not always necessary, as shown in the more generic example of FIG. 4. Elevated contact pads provide additional tolerances, but also are more difficult to fabricate. Using larger particles such as shown in FIGS. 20-22 minimizes the need for elevated contact pads. FIGS. 20-22 show use of a large solder ball as the "conducting particle."

The structure of FIGS. 20-22 may be used to place solder bumps or balls onto substrates and chips. A gold surfaced solder ball may be used for self-assembly since as previously described, there are many surface treatments for promoting the self-assembly of particles with gold surfaces. In addition, as shown in FIG. 20, a surface treatment 2004 applied to contact 2008 may hold solder ball 2103 in place. FIG. 21 shows surface treatment 2004 causing solder ball 2103 to adhere to contact 2008. Once solder ball 2103 is attached, heating to reflow the solder tightens the solder-contact pad bond as shown in FIG. 22.

The described method for attaching solder may be used in cooperation with standard surface mount technology (SMT) processes to attach components to a printed circuit board. Compared to traditional solder methods, the described process minimizes non-recurring engineering cost, in particular, the engineering cost associated with creating a screening stencil or a plating mask.

The example particles illustrated so far have been spherical in shape. In its simplest form, particles used during self-assembled interconnect fabrication may be the same particles used in making anisotropic conducting film (ACF) tape. However, it is not necessary that such particles be used, nor are the particles necessarily spherical. Specially made elliptical shapes, anisotropic shapes, pyramidal shapes and as well as other shapes with pointed tips may also be used. Pointed tips may provide crushable or compliant structures designed to improve electrical contact when the second contact pad sandwiches the particles between the first contact pad and the second contact pad. Larger elastomer filled particles that are more compliant than typical smaller particles may be particularly desirable. In particular, when a 20 micron pad-pitch chip on glass structure is desired, it may be particularly useful to have pads that are approximately 10 microns in size and pads that rise approximately 10 microns.

Figure 23:
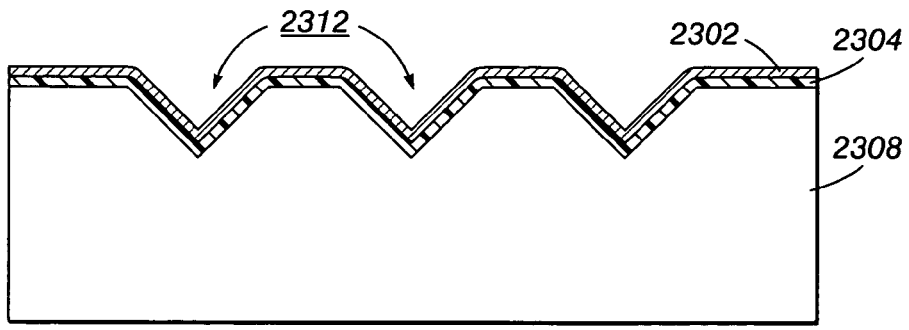
FIGS. 23-28 show one method of fabricating specialized particles which may be used in the self assembly process.
Figure 24:
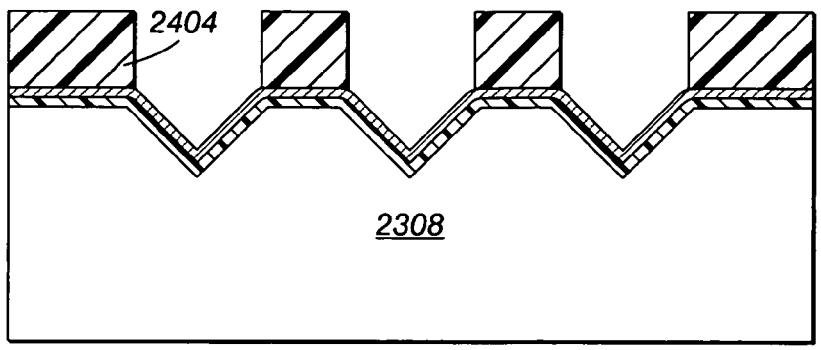
Figure 25:
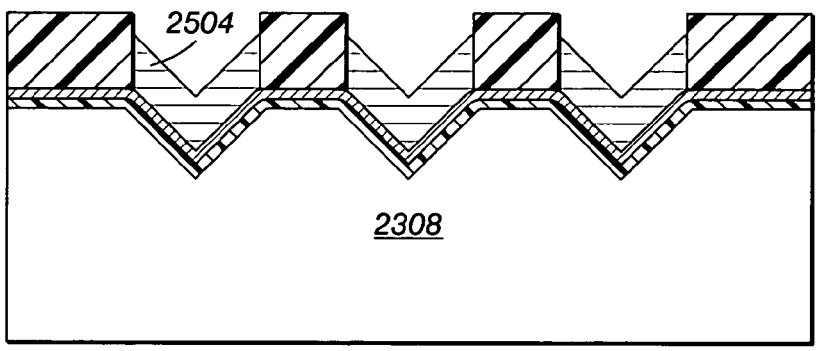

FIGS. 23-28 show one method for forming specialized particles. In FIG. 23, a release layer 2304 and seed layer 2302 are applied to a substrate 2308. Substrate 2308 includes pits 2312 in the desired particle shape. For example, pyramidal shaped pits may be formed on a silicon substrate by anisotropic silicon etching using etchants such as potassium hydroxide. In FIG. 24, a patterned photoresist 2404 defines where particles will be located. FIG. 25 shows particles 2504 plated into substrate 2308 pits 2312.

Figure 26:
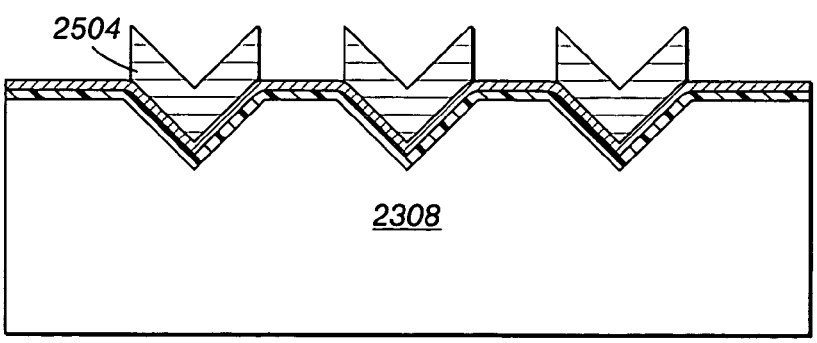
Figure 27:
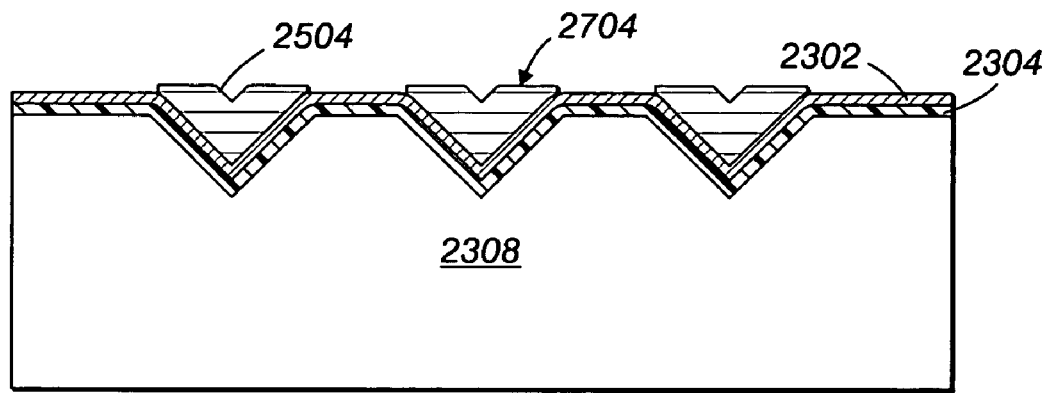
Figure 28:
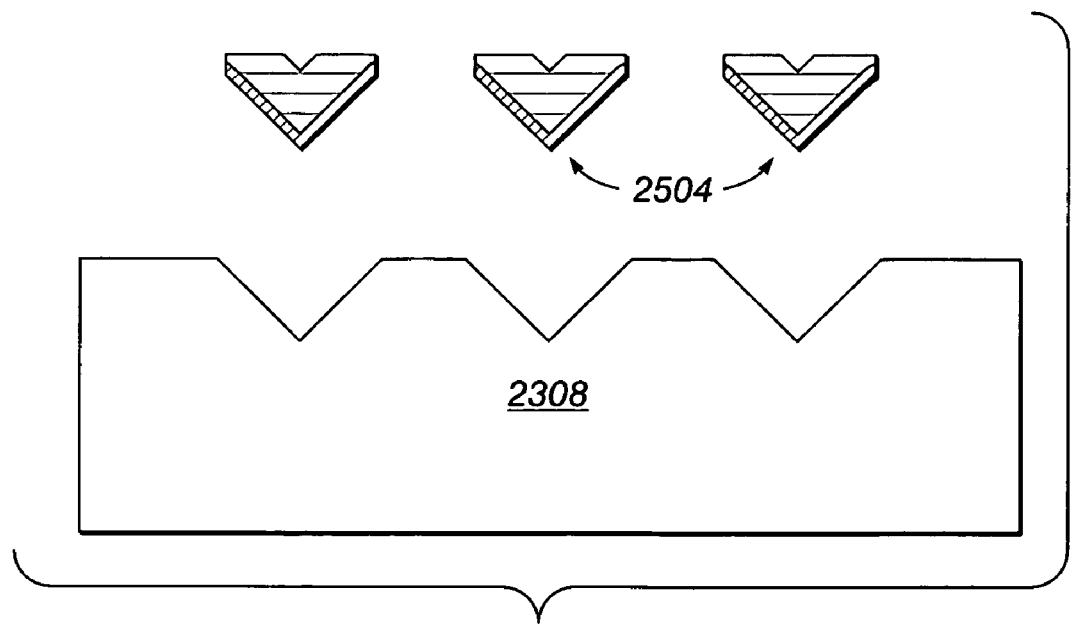

Once the particles have been plated, FIG. 26 shows photoresist 2404 removal. In FIG. 27, the exposed particles 2504 surface are planarized using techniques such as chemical mechanical polishing. Excess seed metal layers are etched away (this step not shown). In one embodiment, the etch exposes a different material in particle 2504 bottom surfaces 2704 compared to other particle surfaces. The different materials exposed on different surfaces makes possible selective adherence of the bottom surface to contact pad bonding surfaces. Thus the particle orientation may be controlled during self assembly. For example, a pyramid structure may be designed such that the pyramid base is made of a different material such that only the pyramid base adheres to the contact pad. Thus the pyramid self-assembles such that a crushable pyramid tip usually orients upwards. In FIG. 28, a release etch releases the particles 2504 from the substrate. The particles may then be collected and used in previously described self-assembly processes.

Different size particles may be used during interconnect fabrication. In one embodiment of this invention, it is desired to introduce at least two distinct sizes of particles. A first size of larger particles creates a bump that is elevated above the substrate surface. Introduction of smaller sized particles coarsens the surface providing penetrating asperities that make or improve electrical contact. The second size particles function in a fashion analogous to the particles that are embedded in an anisotropic conducting film (ACF) used for chip on glass bonding. FIGS. 29-34 show a system to self-assemble both the bump structure as well as the contact pressure concentrating asperities.

Figure 29:
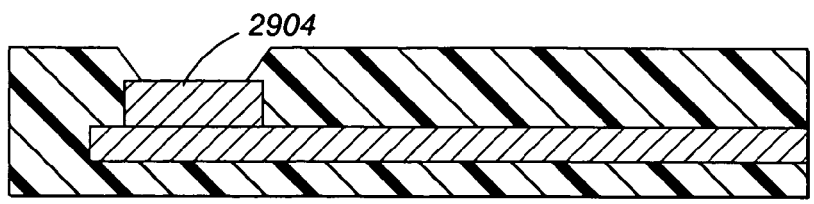
FIGS. 29-34 show a system to self-assemble both a contact bump structure as well as contact pressure concentrating asperities
Figure 30:
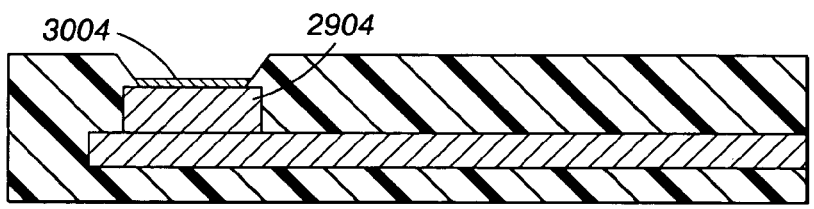
Figure 31:
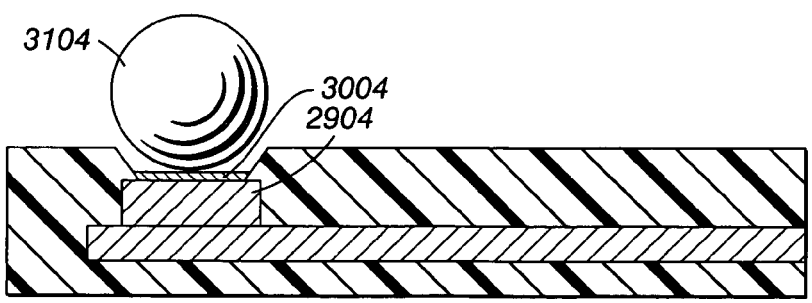

FIG. 29-32 shows the formation of a raised bump structure by self assembling a raised bump structure onto a contact pad. FIG. 29 shows the formation of a contact pad 2904 while FIG. 30 shows the deposition of a bonding layer 3004 onto the contact pad 2904. A large particle 3104 with a surface that has a chemical affinity for bonding layer 3004 adheres to bonding layer 3004 in FIG. 31. A number of mechanisms for such chemical affinity have been previously described, including but not limited to poly(thiophene)-thiol and amine interactions.

Figure 32:
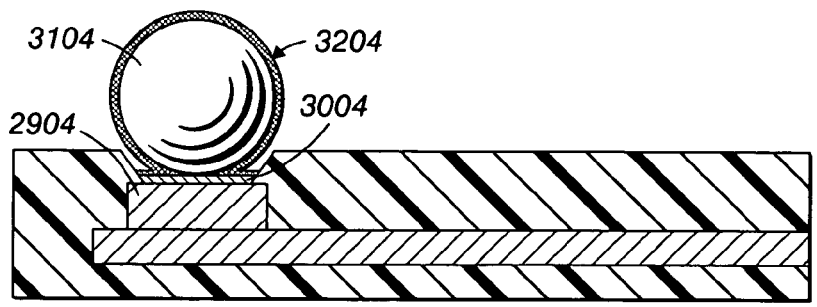
Figure 33:
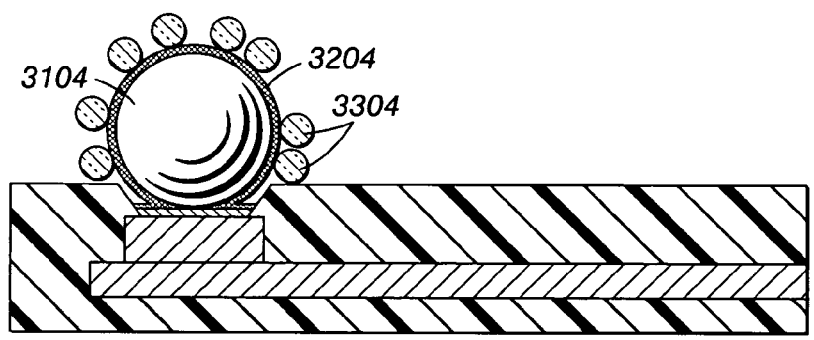
Figure 34:
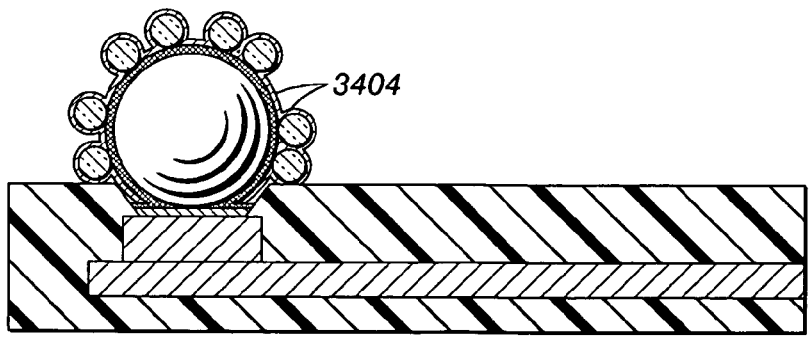

In FIG. 32, large particles 3104 are optionally plated in place, for example by immersing the structure in an electroless plating bath, creating a conformal layer of metal 3204 over the particle and pad. A second particle bonding layer (not shown) is then applied to the plated surface. FIG. 33 shows a smaller second set of particles 3304 "self assembling" or bonding to said second particle bonding layer. The smaller particles are typically 1 to 10 micrometers in diameter. FIG. 34 shows optionally plating the smaller particles in place by forming an additional conformal plated metal layer 3404 by for example the method of electroless plating. The shown structure provides a completely self-assembled "contact bump" with contact pressure asperities.

Although the FIGS. 29-34 show assembly of the bump structure prior to adding the contact pressure asperities, it should be understood that in an alternative embodiment, the large particle 3104 may first be covered with and bonded to smaller particles prior to bonding to the contact pad. Thus, after the large "bump" particle is covered with smaller "contact asperity" particles to form a "coarse bump structure", the entire coarse bump structure is self-assembled onto the contact pad.

In the preceding description a number of details have been provided including particle materials, particle shapes, surface treatments, the composition of bonding layers, the contact pad materials, various dimensions, among other miscellaneous details. It should be understood that such details are provided by way of example and to facilitate understanding of the invention. However, such details are not intended, and should not be used to limit the invention. Instead, the invention should only be limited by the claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. For example, photoresist has been used as a masking material, however, resists of other types, such as wax may be used, and patterning methods other than photolithography such as printing may be substituted.

What is claimed is:

1. An interconnect system comprising:
   a circuit coupled to a contact pad;
   a first particle bonded to the contact pad, exposing the first particle bonded to the contact pad to a plurality of second particles, the first particle and the second particles being substantially spherical, the first particle being larger in size than the second particles and the second particles having a diameter between 1 and 10 micrometers such that the second particles attach to a surface of the first particle wherein a bond between the contact pad and the first particle is a covalent bond and a bond between the first particle and the second particles is also a covalent bond; and,
   a conformal metal coating covering the contact pad the first particle and the second particles, the conformal metal coating deposited after the particle has bonded first to the contact pad, and the second particles attach to the first particle thereby creating a metal layer that conforms to the contours of a surface of the combined contact pad, first particle bonded to the contact pad and second particles attached to the first particle.

2. The interconnect system of claim 1 wherein the first particle is a substantially spherical particle having a diameter greater than 10 microns and up to 500 microns.

3. The interconnect system of claim 1 further comprising:
   a second contact pressed into the conformal metal coating, the second contact forming an electrical connection with the contact pad.

4. The interconnect system of claim 3 wherein the circuit is a driver circuit for a display system and the second contact is coupled to an address line to address pixels in a display.

5. The interconnect system of claim 1 wherein the circuit is a driver circuit for a display system.

6. The interconnect system of claim 1 wherein the conformal metal coating is formed by immersing the contact pad in an electroless plating bath.

7. The interconnect system of claim 1 wherein the first particle is freely moving in a non-solid medium immediately prior to being bonded to the contact pad.

8. The interconnect system of claim 7 wherein the non-solid medium is a liquid.

* * * * *